(12) United States Patent
Chen et al.

(10) Patent No.: US 8,217,735 B2
(45) Date of Patent: Jul. 10, 2012

(54) HARMONIC SUPPRESSION DEVICE

(75) Inventors: Shyue-Dar Chen, Taipei Hsien (TW); Chih-Ming Hung, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 373 days.

(21) Appl. No.: 12/603,654

(22) Filed: Oct. 22, 2009

(65) Prior Publication Data

US 2011/0032052 A1 Feb. 10, 2011

(30) Foreign Application Priority Data

Aug. 6, 2009 (CN) ...................... 2009 2 0307492 U

(51) Int. Cl.
*H03H 7/00* (2006.01)
*H03F 3/213* (2006.01)
*H04B 1/04* (2006.01)

(52) U.S. Cl. ......... 333/185; 333/81 A; 330/302; 330/66; 455/114.1; 307/105

(58) Field of Classification Search .................. 333/185, 333/81 A, 35, 204, 247; 330/302, 66; 455/114.1; 307/105

See application file for complete search history.

(56) References Cited

U.S. PATENT DOCUMENTS

| 5,576,537 | A | 11/1996 | Holzapfel et al. | |
|---|---|---|---|---|
| 6,670,801 | B2 * | 12/2003 | Jian et al. | 324/95 |
| 6,803,817 | B2 * | 10/2004 | Winslow et al. | 330/126 |
| 7,158,386 | B2 * | 1/2007 | Shih et al. | 361/760 |
| 7,221,240 | B2 * | 5/2007 | Chang | 333/176 |
| 7,368,998 | B2 * | 5/2008 | Abe et al. | 330/307 |
| 8,018,290 | B2 * | 9/2011 | Mizutani et al. | 331/60 |
| 8,076,994 | B2 * | 12/2011 | Farrell et al. | 333/32 |
| 2009/0036068 | A1 * | 2/2009 | Hughes et al. | 455/114.1 |

\* cited by examiner

*Primary Examiner* — Barbara Summons
(74) *Attorney, Agent, or Firm* — Altis Law Group, Inc.

(57) ABSTRACT

A harmonic suppression device includes a multilayer printed circuit board (PCB). The multilayer PCB includes a first layer, a second layer, and a third layer. The third layer is connected to the ground. The first layer is configured with a power amplifier, an input microstrip, a voltage divider microstrip, and an output microstrip. The power amplifier is operable to amplify radio frequency (RF) signals input using the input microstrip and to output the amplified RF signals using the output microstrip. The second layer is configured with a first microstrip and a second microstrip. One end of each of the first and second microstrips is connected to an alternative one of the first layer and the third layer by vias, and the other ends of the first and second microstrips are unattached so as to suppress harmonics on the power amplifier.

6 Claims, 5 Drawing Sheets

HARMONIC SUPPRESSION DEVICE

BACKGROUND

1. Technical Field

Embodiments of the present disclosure relate to wireless communication, and more particularly to a harmonic suppression device utilized thereby.

2. Description of Related Art

Wireless communication protocols usually require noise generated by wireless terminals to be below a set value. Because of nonlinearity of power amplifiers and other elements in those wireless terminals radiating from high power loads, harmonics of transmission signals generate high noise, such as quadric harmonics and third harmonics, easily exceeding the desired limit. Suppression of harmonics to linearize output of the power amplifiers is thus critical.

Currently, most attempts at suppression apply patched low pass filters after the power amplifiers to filter the harmonics. However, the patched low pass filters incorporate a plurality of elements, increasing cost and size of the wireless terminals. In addition, loss, inherent in most patched low pass filters reduces output power and increases wasted power. Therefore, a heretofore unaddressed need exists to address the limitations described.

BRIEF DESCRIPTION OF THE DRAWINGS

The details of the disclosure, both as to its structure and operation, can best be understood by referring to the accompanying drawings, in which like reference numbers and designations refer to like elements.

DETAILED DESCRIPTION

Figure 1:
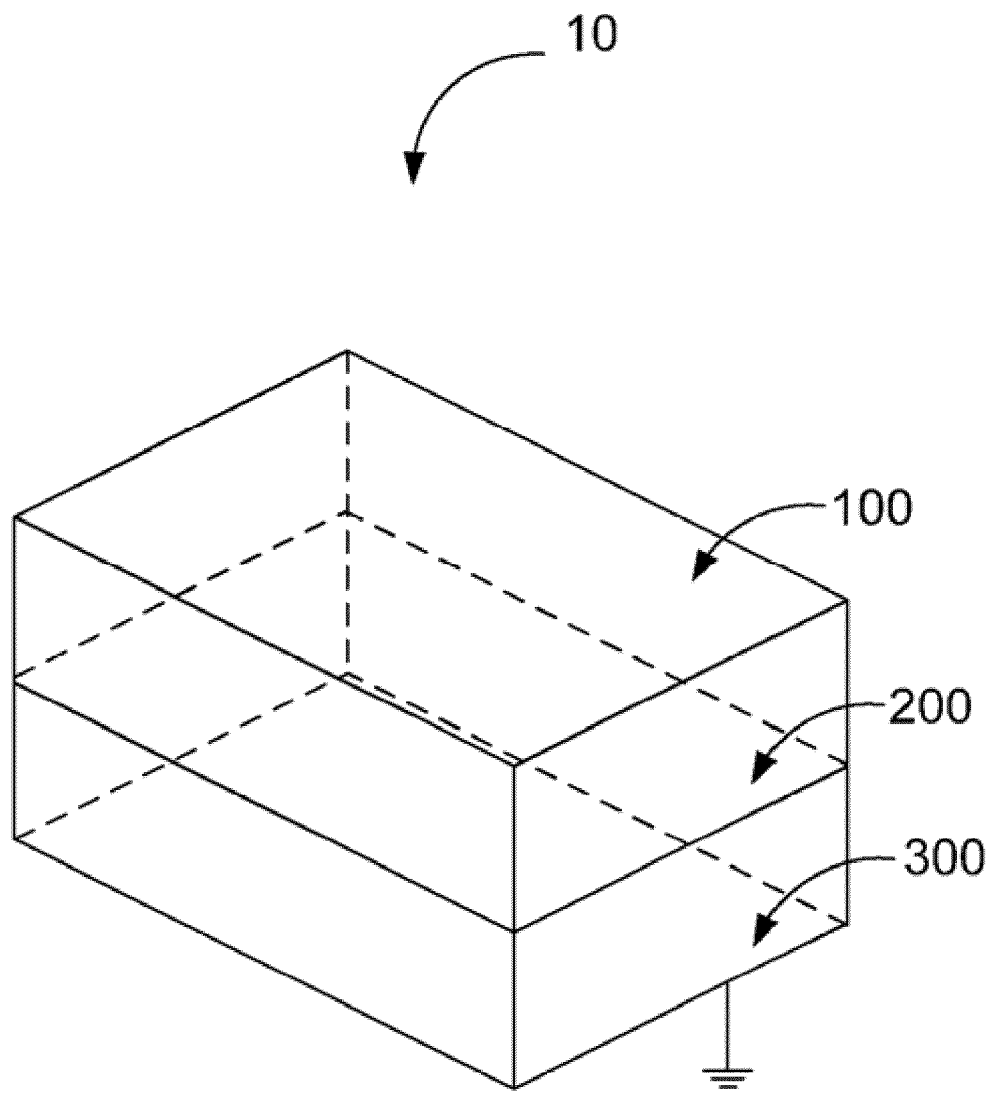
FIG. 1 is a schematic diagram of one embodiment of three layers of a harmonic suppression device of the present disclosure.
Figure 2:
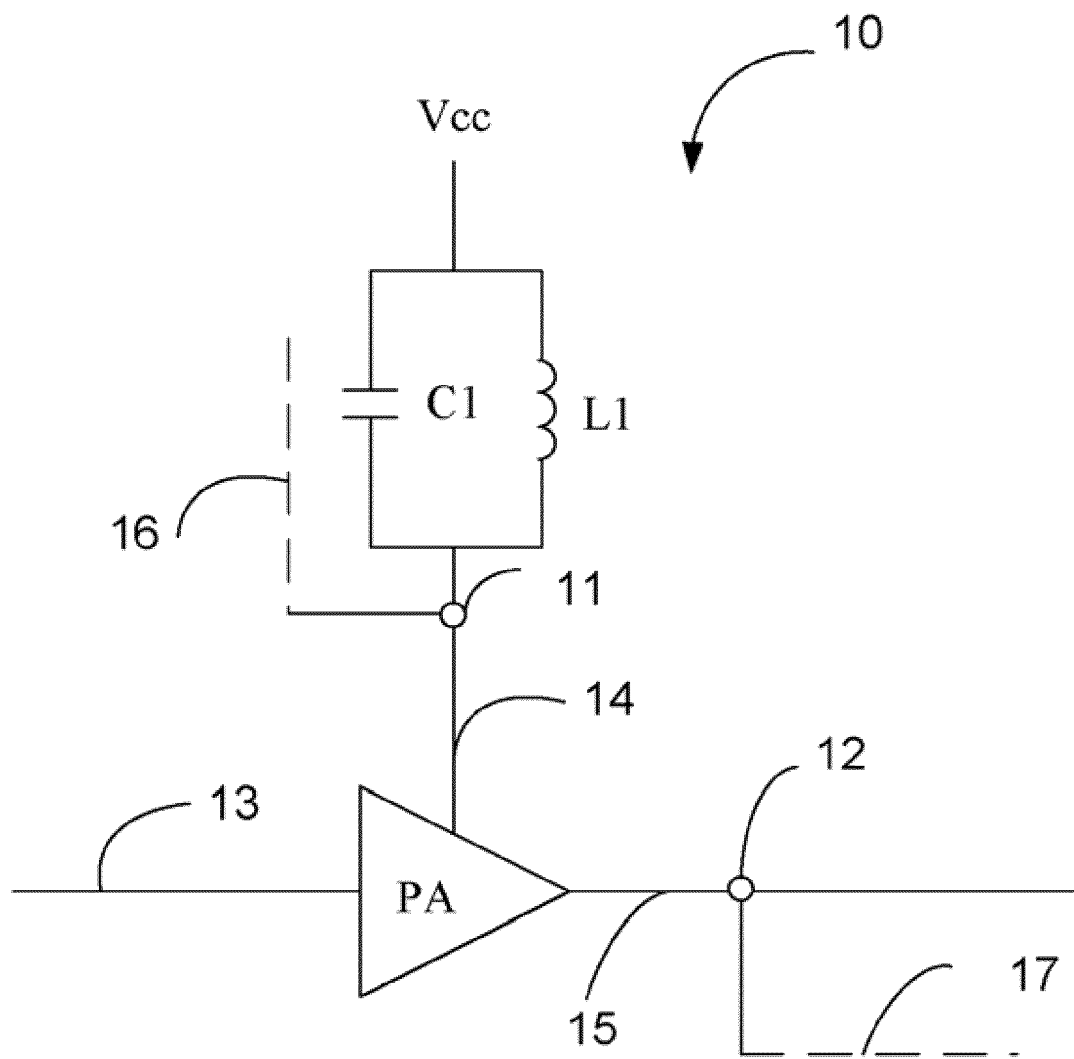
FIG. 2 is a schematic diagram of one embodiment of a harmonic suppression device of the present disclosure.

FIG. 1 is a schematic diagram of one embodiment of three layers of a harmonic suppression device 10 of the present disclosure. FIG. 2 is a schematic diagram of one embodiment of a harmonic suppression device 10 of the present disclosure.

The harmonic suppression device 10 includes a multilayer printed circuit board (PCB). In one embodiment, the multilayer PCB includes a first layer 100, a second layer 200, and a third layer 300. The third layer 300 is connected to ground.

The first layer 100 is configured with a power amplifier PA, an input microstrip 13, a voltage divider microstrip 14, and an output microstrip 15. The harmonic suppression device 10 is used to improve linearity of the power amplifier PA. The power amplifier PA is operable to amplify radio frequency (RF) signals input using the input microstrip 13 and to output the amplified RF signals using the output microstrip 15. The voltage divider microstrip 14 is operable to transmit an external voltage Vcc to the power amplifier PA. In one embodiment, the voltage divider microstrip 14 and the output microstrip 15 are connected to different pins of the power amplifier PA.

In one embodiment, the first layer 100 is further configured with a capacitor C1 and an inductor L1. The capacitor C1 and the inductor L1 are connected in parallel and subsequently connected to the voltage divider microstrip 14, to transmit the external voltage Vcc to the power amplifier PA.

The second layer 200 is configured with a first microstrip 16 and a second microstrip 17 to improve linearity of the power amplifier PA. One end of each of the first and second microstrips 16, 17 is connected to the first layer 100 by vias. The other ends of each of the first and second microstrips 16, 17 are unattached so as to suppress harmonics on the power amplifier PA.

In one embodiment, the PCB defines a first via 11 and a second via 12 through the first layer 100 to the second layer 200. In the first layer 100, the first via 11 is defined in the voltage divider microstrip 14 and the second via 12 is defined in the output microstrip 15.

As such, one end of the first microstrip 16 is connected to the voltage divider microstrip 14 of the first layer 100 by the first via 11 and another end of the first microstrip 16 is unattached. One end of the second microstrip 17 is connected to the output microstrip 15 of the first layer 100 using the second via 12 and another end of the second microstrip 17 is unattached. In one embodiment, the first and second microstrips 16, 17 are both a quarter wavelength of a suppressed power amplifier PA harmonic in length.

Figure 3:
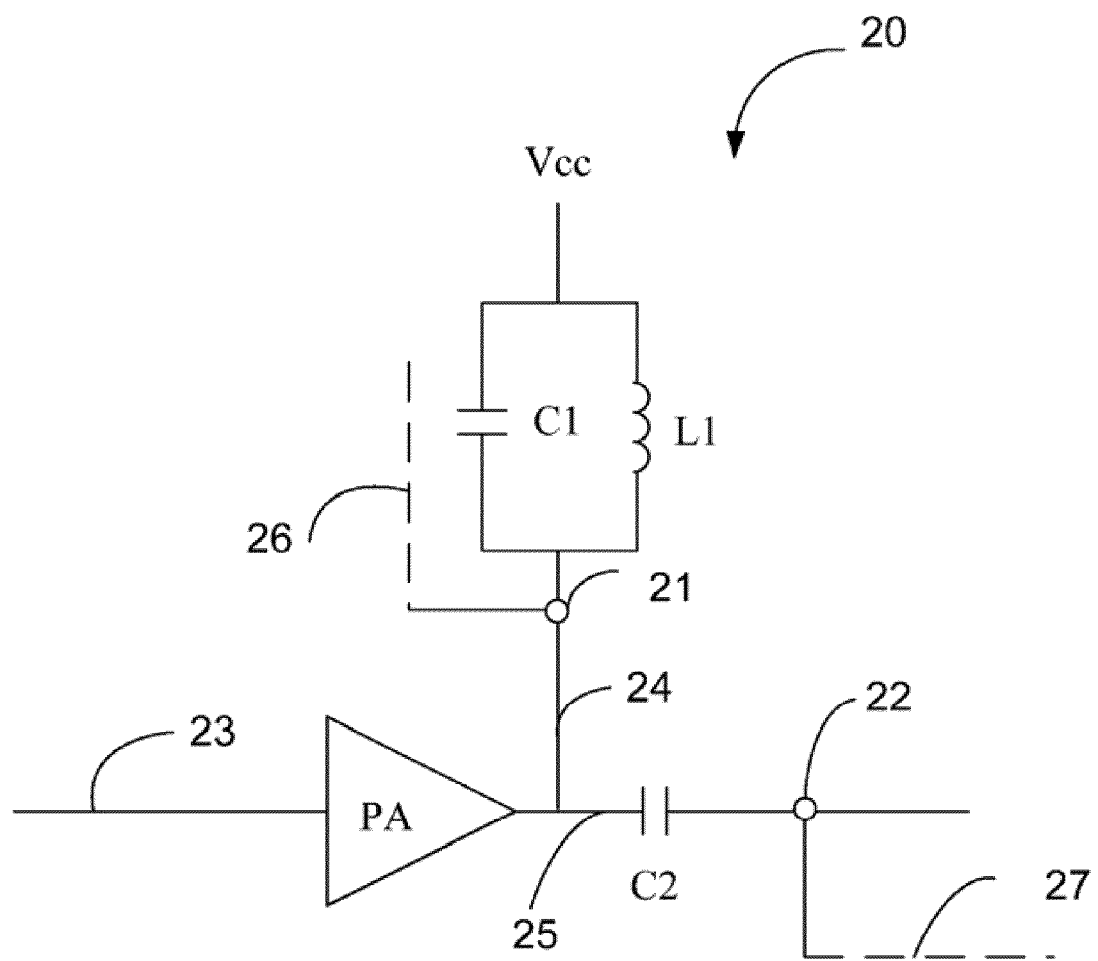
FIG. 3 is a schematic diagram of another embodiment of a harmonic suppression device of the present disclosure.

FIG. 3 is a schematic diagram of another embodiment of a harmonic suppression device 20 of the present disclosure, differing from the harmonic suppression device 10 of FIG. 2 in that the voltage divider microstrip 24 and the output microstrip 25 are connected to one and the same pin of the power amplifier PA. The output microstrip 25 is connected to the second microstrip 27 on the second layer 200 using a capacitor C2.

Figure 4:
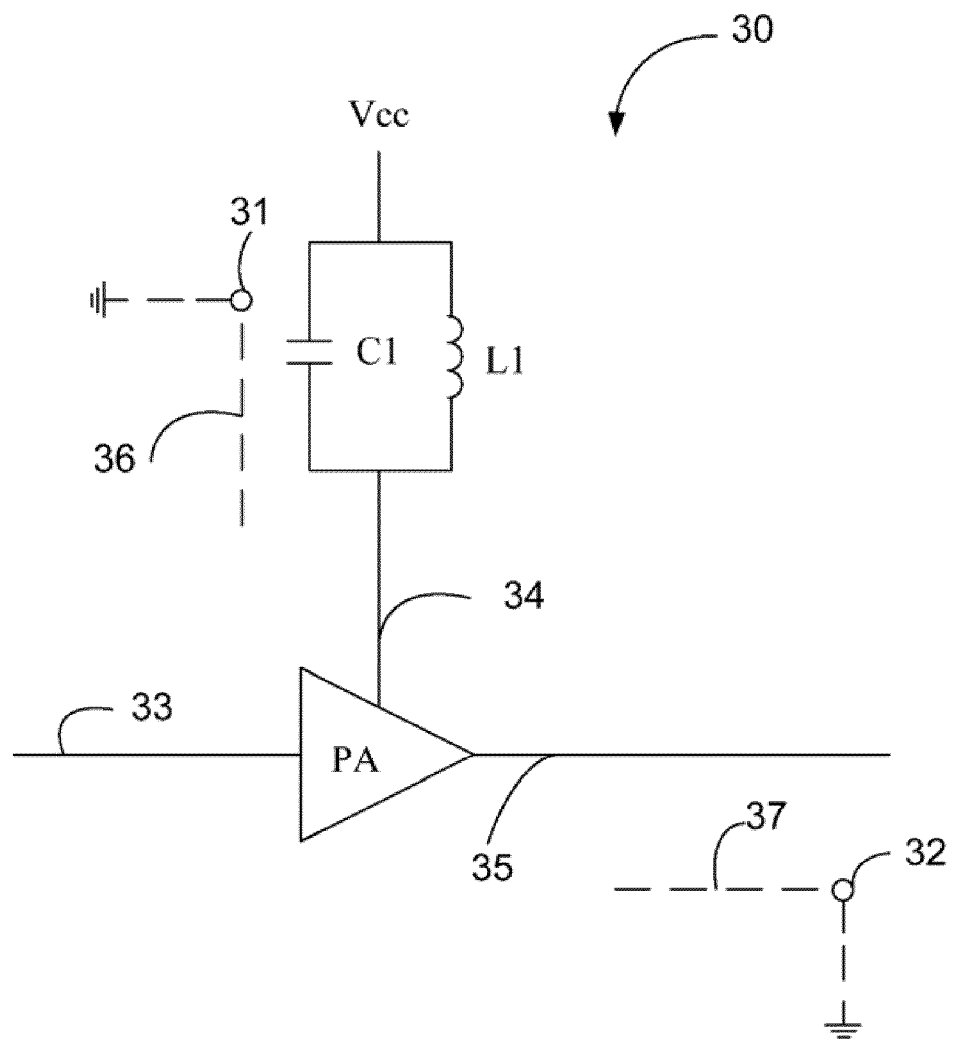
FIG. 4 is a schematic diagram of another embodiment of a harmonic suppression device of the present disclosure.

FIG. 4 is a schematic diagram of another embodiment of a harmonic suppression device 30 of the present disclosure, differing from the harmonic suppression device 10 of FIG. 2 in that one end of each of the first and second microstrips 36, 37 is connected to the third layer 300 by vias.

In one embodiment, the PCB defines a third via 31 and a fourth via 32 through the second layer 200 to the third layer 300. In detail, one end of the first microstrip 36 is connected to the third layer 300 and then to the ground using the third via 31, and another end of the first microstrip 36 is unattached. One end of the second microstrip 37 is connected to the third layer 300 and then to the ground using the fourth via 32, and another end of the second microstrip 37 is unattached.

Figure 5:
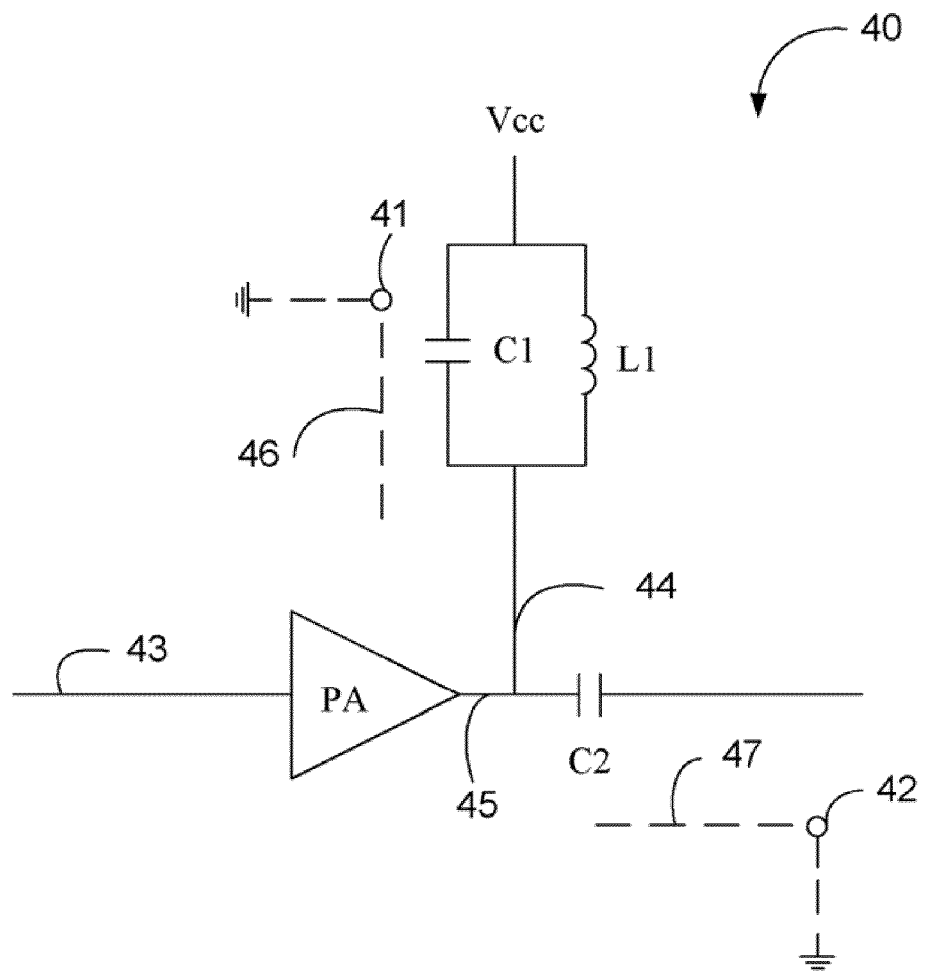
FIG. 5 is a schematic diagram of another embodiment of a harmonic suppression device of the present disclosure.

FIG. 5 is a schematic diagram of another embodiment of a harmonic suppression device 40 of the present disclosure, differing from the harmonic suppression device 30 of FIG. 4 in that the voltage divider microstrip 44 and the output microstrip 45 are connected to one and the same pin of the power amplifier PA. The output microstrip 45 outputs the RF signals using a capacitor C2.

As such, one end of each of the first and second microstrips is connected to an alternative one of the first layer 100 and the third layer 300 by vias. The other ends of the first and second microstrips are unattached to suppress harmonics on the power amplifier PA. Therefore, embodiments of the harmonic suppression devices of the present disclosure suppress the harmonic of the power amplifier PA by the multilayer PCB, which improves linearity of the power amplifier PA and then linearizes the output of the power amplifier PA.

In addition, embodiments of the harmonic suppression devices of the present disclosure are all implemented by PCB, which reduces cost, element number, and size of wireless terminals. Furthermore, the PCB is much more reliable than patched elements. Therefore, embodiments of the harmonic suppression devices of the present disclosure have fewer elements but higher reliability.

While various embodiments and methods of the present disclosure have been described above, it should be understood that they have been presented using example only and not using limitation. Thus the breadth and scope of the present disclosure should not be limited by the above-described embodiments, but should be defined only in accordance with the following claims and their equivalents.

What is claimed is:

1. A harmonic suppression device comprising a multilayer printed circuit board (PCB), wherein the multilayer PCB comprises:
   a first layer configured with a power amplifier, an input microstrip, a voltage divider microstrip, and an output microstrip, wherein the power amplifier is operable to amplify radio frequency (RF) signals input using the input microstrip and to output the amplified RF signals using the output microstrip, and the voltage divider microstrip is operable to transmit an external voltage to the power amplifier;
   a second layer configured with a first microstrip and a second microstrip, the first microstrip and the second microstrip operable to improve linearity of the power amplifier; and
   a third layer connected to ground;
   wherein one end of each of the first and second microstrips is connected to an alternative one of the first layer and the third layer by vias, and the other ends of the first and second microstrips are unattached to suppress harmonics on the power amplifier.

2. The harmonic suppression device as claimed in claim 1, wherein one end of the first microstrip is connected to the voltage divider microstrip on the first layer.

3. The harmonic suppression device as claimed in claim 2, wherein one end of the second microstrip is connected to the output microstrip on the first layer.

4. The harmonic suppression device as claimed in claim 1, wherein the first and second microstrips are both connected to the third layer.

5. The harmonic suppression device as claimed in claim 1, wherein the first and second microstrips are both a quarter of the wavelength of the suppressed harmonic of the power amplifier in length.

6. The harmonic suppression device as claimed in claim 1, wherein the first layer is further configured with a capacitor and an inductor connected in parallel, and subsequently connected to the voltage divider microstrip to transmit the external voltage to the power amplifier.

* * * * *